May 17, 1966 E. KOOI 3,252,062

ZENER DIODE

Filed April 9, 1962

INVENTOR

ELSE KOOI

BY

AGENT 3,252,062
ZENER DIODE
Else Kooi, Eindhoven, Netherlands, assignor to North American Philips Company, Inc., New York, N.Y., a corporation of Delaware
Filed Apr. 9, 1962, Ser. No. 186,153
Claims priority, application Netherlands, May 24, 1961, 265,122
2 Claims. (Cl. 317—235)

Figure 1:
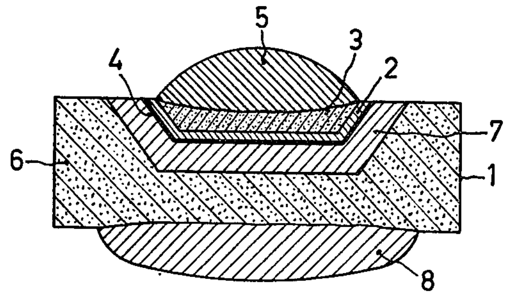

The invention relates to a Zener diode comprising a semi-conductor body of a certain conductivity type having a zone of a conductivity type opposite to that of the semi-conductor body, which zone is provided with an electrode, and a p-n-junction between this zone and the remainder of the semi-conductor body, and to a circuit using such a diode.

The invention also relates to a method of manufacturing such Zener diodes by providing semi-conductor bodies of the same conductivity type with a zone of a conductivity type opposite to that of the semi-conductor bodies, which zone is provided with an electrode, and hence with a p-n-junction between the said zone and the remainder of the semi-conductor bodies.

The term "Zener diode" is used herein to denote in the usual manner a diode suitable as a voltage limiter, that is to say, a diode having such a characteristic in the reverse direction that up to a certain reproducible voltage, the breakdown voltage, there is a very small leakage current, while, if the reverse voltage reaches the breakdown voltage, the current is abruptly and greatly increased. The term "Zener-diode" is not restricted to denote a diode in which the breakdown voltage is caused by the Zener effect but includes in the usual manner a diode in which the avalanche effect is significant. In general a Zener diode has two electrodes, however, several diodes may be provided on one semi-conductive strip.

Zener diodes of the above-mentioned known type suffer from the disadvantage that they cannot readily be manufactured reproducibly in large numbers. It has been found that the breakdown voltage of a Zener diode depends upon the pattern of the concentrations of impurities in the proximity of the p-n-junction.

Zener diodes of the said known type may be manufactured by melting an amount of electrode material on a semi-conductor body so that by recrystallisation or diffusion a p-n-junction is produced. Such Zener diodes may also be manufactured by diffusion of impurities into a surface layer of a semi-conductor crystal so as to produce a p-n-junction and by the provision of an electrode on this surface layer. The breakdown voltage of such devices is highly dependent upon the specific resistivity of the semi-conductive starting material, for the specific resistivity on one side of the p-n-junction is maintained equal to the specific resistivity of the starting material. This means that to manufacture a large number of Zener diodes having the same breakdown voltage from one large single crystal by dividing this crystal into small crystals which are provided with p-n-junctions in the above-described manner, one must start from a crystal having highly homogeneous properties. Such homogeneous crystals, however, cannot readily be manufactured so that the manufacture of a large number of Zener diodes with reproducible properties is rendered very difficult. Thus, for example, n-type silicon is particularly disadvantageous as a starting material for mass manufacture by the said methods since this material has great variations in properties.

It is an object of the present invention to provide a structure for a Zener diode by which the said disadvantage of the known Zener diodes are obviated, and to provide a particularly suitable method of manufacturing such a Zener diode.

According to the invention, in a Zener diode comprising a semi-conductor body of a certain conductivity type having a zone of a conductivity type opposite to that of the semi-conductor body, which zone is provided with an electrode, and a p-n-junction between this zone and the remainder of the semi-conductor body, at least in a part of the remainder of the semi-conductor body adjoining the said p-n-junction the concentration of impurities having the same conductivity type as the semi-conductor body is increased. By this increase the concentrations of the impurities on both sides of the p-n- junction are rendered largely independent of the concentrations of impurities in the starting materials, so that the reproducibility is increased.

The said part of the semi-conductor body in which the concentration of impurities having the same conductivity type as the semi-conductor body is increased may be a part obtained by recrystallization or by deposition from vapour. Preferably, however, in the Zener diode in accordance with the invention the said part is a diffused part so that manufacture is greatly simplified.

A particularly suitable method of manufacturing Zener diodes in accordance with the invention by providing semi-conductor bodies of the same conductivity type each with a zone of a conductivity type opposite to that of the semi-conductor bodies, which zone is provided with an electrode, and hence with a p-n-junction between the said zone and the remainder of each semi-conductor body, is characterized in that in a number of semi-conductor bodies, at least in a part of the remainder of each semi-conductor body adjoining the said p-n-junction, the concentration of impurities is increased by diffusing into that part impurities of the same conductivity type as that of the semi-conductor bodies in a concentration which is at least equal to the concentration of impurities of the same conductivity type in that semi-conductor body having the highest concentration. As a result, the adverse influence of differences in concentration between the semi-conductor bodies upon the reproducibility is largely prevented. This influence may be further reduced by increasing the concentration of the diffused impurities. Preferably the impurities are diffused in a concentration which is five times the said highest concentration.

The method in accordance with the invention may be carried out by providing a number of semi-conductor bodies by diffusion of impurities each with a surface layer having this increased concentration and then providing on each diffused layer an electrode of a conductivity type opposite to that of the semi-conductor bodies. A preferred embodiment of the method in accordance with the invention, however, consists in that an amount of electrode material is alloyed to the semi-conductor bodies and during the alloying process the impurities used to produce the increased concentration are diffused into the semi-conductor bodies, while the electrode material also contains the impurities required to produce the zone having a conductivity type opposite to that of the semi-conductor bodies, the former impurities having a diffusion velocity higher than that of the latter impurities, while the electrode is provided on this zone by cooling from the electrode material, the segregation of the impurities required to produce the said zone predominating over that of the other impurities.

This preferred embodiment of the method in accordance with the invention has the advantage that the part having an increased concentration of impurities, the zone having a conductivity type opposite to that of the semi-conductor body, and the electrode on this zone are produced by a single alloying process. Consequently, difficulties which may arise in the provision of contacts of thin diffused layers are obviated. Because the diffusion and the segregation start from the melting front, a particularly high reproducibility of the pattern of the concentrations of impurities in the proximity of the p-n-junction is obtained irrespective of the depth of penetration of the melting front.

The electrode material to be alloyed may contain both types of impurities. However, the impurities may combine to form a compound during the composition of the electrode material so that it is very difficult to obtain a supply of electrode material sufficient to manufacture a number of diodes and having a highly homogeneous composition as required to obtain a high reproducibility. Compounds of impurities and a neutral electrode material are likewise possible. Consequently, it is of particular advantage in these cases for at least one of the types of impurities to be added to the electrode material during the alloying process, preferably in the vapour state. This enables the composition of the electrode material for a large number of diodes to be made reproducible.

The addition to the alloyed electrode material is preferably performed by disposing the semi-conductor bodies so that their electrode material faces a homogeneous supply of impurities, preferably over this supply, the impurities being supplied in the vapour state to the electrode material from the said supply.

This ensures a homogeneous distribution of the impurities over the electrode material melts in a simple manner.

Figure 2:
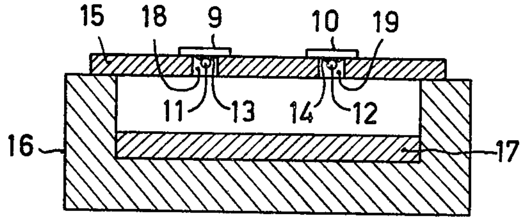
Figure 3:
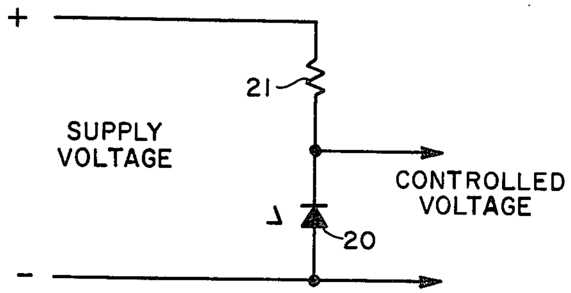

In order that the invention may readily be carried out, an embodiment thereof will now be described in detail, by way of example, with reference to the accompanying diagrammatic drawings, in which:

FIGURE 1 is a cross-sectional view of a Zener diode in accordance with the invention, and FIGURE 2 is a cross-sectional view of a number of Zener diodes in accordance with the invention during manufacture, and FIGURE 3 is a schematic of a typical voltage-limiting circuit using a Zener diode.

An embodiment of a Zener diode in accordance with the invention comprises a semi-conductor body 1 of a certain conductivity type in the form of a semi-conductor body of p-type silicon. This body includes an n-type zone (2, 3) comprising a diffused zone 2 and a recrystallised zone 3 in which the predominating impurities are, for example, arsenic, and a generally dish-shaped p-n-junction 4. On this zone 2, 3 is provided an electrode 5 consisting of an alloy of, for example, tin, arsenic, and aluminum. The remainder 6, 7 of the semi-conductor body 1 includes a generally dish-shaped diffused part 7 having an increased concentration of impurities and adjoining the p-n-junction. The impurities diffused into this part may be aluminum. There is further provided an ohmic electrode 8 which may also consist of aluminum.

Such Zener diodes may be manufactured by the method an example of which is described hereinafter. For the sake of simplicity the example relates to only two semi-conductor bodies in the form of two wafers 9 and 10 (see FIGURE 2) of p-type silicon having a diameter of about 2 mms. and a thickness of about 150 microns. The wafers 9 and 10 have specific resistivities of 0.08 ohm-cm. and 1.5 ohm-cm. respectively, corresponding to concentrations of impurities of about $3\times10^{17}$ atoms per $cm.^3$ and $1.5\times10^{16}$ atoms per $cm.^3$ respectively. Pellets 11 and 12 of electrode material are secured with the aid of a fatty adhesive 13 and 14 respectively to the wafers 9 and 10 respectively. The fatty adhesive may be provided by dipping the wafers into a one-half-percent solution of neat's-foot-oil (oleum pedun tauri) in acetone. After extracting the wafers from the solution, the surface of the wafers is covered with a layer of solution having a thickness of about 100 microns, from which the solvent evaporates rapidly leaving an extremely thin layer of neat's-foot-oil behind, forming the adhesive. Neat's foot oil is a purified distillate from bone-oil and will evaporate entirely on heating. The pellets have a diameter of 250 microns and consist of a tin-arsenic alloy having an arsenic content of ½% by weight, the tin being a neutral carrier material and the arsenic forming the donor impurities required to produce an n-type zone in the p-type wafers. The acceptor impurities required to produce a part of increased concentration are added subsequently during the process of alloying the electrode pellets. The acceptor impurities consist of aluminum which has a higher diffusion velocity into silicon than arsenic, whereas in segregation arsenic predominates. For this purpose the wafers are disposed on a common support 15 which is provided with two apertures 18 and 19 which are covered by the wafers so that the pellets are accommodated in the apertures. The support is arranged in the manner shown in the figure on a boat 16 so that the electrode pellets face the bottom. A suitable material for the support and the boat is graphite. On the bottom of the boat 16 is provided a homogeneous supply of acceptor impurities in the form of a layer 17 of powdered aluminum. This arrangement ensures a homogeneous distribution of the aluminum over the electrode melts during the heat treatment. Heating may be performed in a nitrogen atmosphere. The assembly is raised from room temperature to 1000° C. in three minutes and subsequently to 1090° C. in three minutes. In this process aluminum vaporises and dissolves in the molten electrode material. The molten pellets 11 and 12 remain in place due to surface tension forces. The assembly is cooled to 1040° C. in 10 seconds and maintained at this temperature for 20 minutes to enable the aluminum to be diffused into the wafers 9 and 10 so that the parts of increased concentration are produced (these parts are designated by 7 in FIGURE 1). Near the p-n-junction the increased concentration is about $4\times10^{18}$ impurity atoms per $cm.^3$. Thus, this concentration is greater by a factor 10 than the initial concentration in the wafer having the higher concentration. During this heat treatment diffusion of arsenic also occurs but in a lesser degree owing to the fact that the diffusion velocity of arsenic is smaller than that of aluminum. As is indicated in FIGURE 1, the p-n-junction 4 is produced at some distance from the melting point. The assembly is subsequently cooled to room temperature, a recrystallised n-type zone 3 being produced in which arsenic predominates, while from the solidifying electrode material an electrode 5 is formed on this zone. The wafers are then provided with ohmic contacts 8 by alloying aluminum to them.

The resulting Zener diodes are etched in a flowing etching liquid comprising equal parts of glacial acetic acid, fuming nitric acid and an aqueous solution of hydrofluoric acid (48%), for example for 2 seconds, then rinsed in deionized water and dried. Measurements show that the two resulting Zener diodes have a breakdown voltage of from 6.1 to 6.2 volts. If the above-mentioned method is carried out with the sole difference that no acceptor impurities are provided in the boat 16, two Zener diodes having different breakdown voltages are obtained. The Zener diode obtained from the wafer having a specific resistivity of 0.08 ohm-cm. proves to have a breakdown voltage of from 8.9 to 9.0 volts and that obtained from the wafer having a specific resistivity of 1.5 ohm-cm. proves to have a breakdown voltage of from 40 to 45 volts. This clearly shows the effect of the invention on the reproducibility.

It will be appreciated that there are a great number of possible variations of the above-mentioned method.

FIG. 3 illustrates a typical circuit. The diode of FIG. 1 is shown schematically at 20 in series with the usual current limiter or ballast resistor 21 across the supply voltage. The diode 20 is back-biased and operated in its Zener or avalanche region where changes in current produce very little voltage changes. The controlled voltage is taken from across the diode 20.

For example, the method described may be simplified by providing a plurality of electrode pellets on a large disc of semi-conductive material and treating the assembly in the manner described. The disc may subsequently be divided into a number of wafers each provided with at least one alloyed electrode. Thus devices having a number of electrodes may be obtained. Furthermore, the method is not restricted to silicon and to the impurities given in the example, but semi-conductive materials such as germanium and $A_{III}B_{V}$—compounds and other known impurities may also be used. The two impurities may be added to the molten electrode material.

What is claimed is:

1. A voltage-limiting arrangement including a zener-diode comprising a semiconductive body, a first region in said body of one type conductivity, a second surface zone including a recrystallized portion in said body and of the opposite type conductivity and defining a generally dish-shaped p-n junction with the first region, all the portions of the first region adjacent and surrounding the p-n junction and forming a generally dish-shaped region having a concentration of impurities that is greater by at least a factor five than the heaviest concentration of impurities of the first region portions more remote from the junction, said greater concentration of impurities in the portion adjacent the p-n junction being of the same conductivity-forming type as that controlling the conductivity of the first region, an electrode in contact with the second zone, an electrical contact to the remote portions of the first region, and means for applying a voltage across the electrode and contact for biasing the p-n junction in the reverse direction above its breakdown voltage and producing a substantially constant voltage across the diode.

2. A voltage-limiting arrangement including a zener diode comprising a semiconductive body of one type conductivity, a surface zone in said body of the opposite type conductivity including a recrystallized region and a diffused region defining a generally dish-shaped p-n junction with the body portion of one type conductivity, all the portions of the body of one type conductivity adjacent and surrounding the p-n junction being a generally dish-shaped diffused portion having a concentration of impurities that is greater by at least a factor ten than the heaviest concentration of impurities of the body portions of one-type conductivity more remote from the junction, said greater concentration of impurities in the portion adjacent the p-n junction being of the same conductivity-forming type as that controlling the conductivity of the body portions of one-type conductivity, an alloyed electrode in contact with the recrystallized region, an electrical contact to the remote portions of the body of one-type conductivity, said recrystallized region containing impurities of said one type and impurities of the other type but being dominated by the latter, said dish-shaped diffused portion adjacent the junction containing impurities of said one type, said latter impurities having a greater diffusion velocity in the body than the impurities of the other type, and means for applying a voltage across the electrode and contact for biasing the p-n junction in the reverse direction above its breakdown voltage and producing a substantially constant voltage across the diode.

References Cited by the Examiner

UNITED STATES PATENTS

| | | | |
|---|---|---|---|
| 2,849,343 | 8/1958 | Kroger et al. | 148—1.5 |
| 2,914,715 | 11/1959 | Uhlir | 317—235 |
| 2,959,505 | 11/1960 | Riesz | 317—235 |
| 2,959,719 | 11/1960 | Ezaki | 317—235 |
| 3,100,166 | 8/1963 | Marinace et al. | 148—1.5 |
| 3,154,692 | 10/1964 | Schockley | 307—88.5 |

JOHN W. HUCKERT, *Primary Examiner.*

JAMES D. KALLAM, DAVID J. GALVIN, *Examiners.*

L. ZALMAN, *Assistant Examiner.*